(12) United States Patent
Seidl et al.

(10) Patent No.: US 8,049,264 B2
(45) Date of Patent: Nov. 1, 2011

(54) METHOD FOR PRODUCING A DIELECTRIC MATERIAL ON A SEMICONDUCTOR DEVICE AND SEMICONDUCTOR DEVICE

(75) Inventors: Harald Seidl, Pöring (DE); Martin Gutsche, Dorfen (DE); Shrinivas Govindarajan, Niskayuna, NY (US)

(73) Assignee: Qimonda AG, Munich (DE)

( * ) Notice: Subject to any disclaimer, the term of this patent is extended or adjusted under 35 U.S.C. 154(b) by 1264 days.

(21) Appl. No.: 11/044,721

(22) Filed: Jan. 28, 2005

(65) Prior Publication Data

US 2006/0172489 A1 Aug. 3, 2006

(51) Int. Cl.
*H01L 29/94* (2006.01)

(52) U.S. Cl. .............. 257/310; 257/315; 257/E29.165

(58) Field of Classification Search .............. 257/19, 257/59, 306, 310, 288, 347, E21.01, 546, 257/E29.02, E51.007, 410, 165, 411; 438/216, 438/264, 287, 761, 778

See application file for complete search history.

(56) References Cited

U.S. PATENT DOCUMENTS

| | | | | |
|---|---|---|---|---|
| 4,894,696 A * | 1/1990 | Takeda et al. | .......... | 257/303 |
| 5,986,301 A * | 11/1999 | Fukushima et al. | .......... | 257/306 |
| 6,201,291 B1 | 3/2001 | Kordic et al. | | |
| 6,727,134 B1 | 4/2004 | Chen et al. | | |
| 6,833,296 B2 | 12/2004 | Yugami et al. | | |
| 6,844,604 B2 | 1/2005 | Lee et al. | | |
| 7,057,227 B2 | 6/2006 | Lee | | |
| 2002/0050608 A1* | 5/2002 | Landheer et al. | .......... | 257/310 |
| 2002/0121665 A1* | 9/2002 | Kawasaki et al. | .......... | 257/347 |
| 2003/0186559 A1* | 10/2003 | Kim et al. | .......... | 438/761 |
| 2003/0218170 A1* | 11/2003 | Yamazaki et al. | .......... | 257/59 |
| 2004/0067838 A1* | 4/2004 | Mandal et al. | .......... | 501/98.2 |
| 2004/0155225 A1* | 8/2004 | Yamada et al. | ...... | 252/301.4 R |
| 2004/0198069 A1 | 10/2004 | Metzner et al. | | |
| 2004/0266217 A1* | 12/2004 | Kim et al. | .......... | 438/778 |
| 2005/0040481 A1* | 2/2005 | Shimizu et al. | .......... | 257/411 |
| 2005/0093033 A1* | 5/2005 | Kinoshita et al. | .......... | 257/288 |
| 2005/0161663 A1* | 7/2005 | Atanackovic | .......... | 257/19 |
| 2006/0118890 A1* | 6/2006 | Li | .......... | 257/410 |

FOREIGN PATENT DOCUMENTS

JP    2004056067    2/2004

(Continued)

OTHER PUBLICATIONS

Hyung-Seok Jung et al., "Improved Current Performance of CMOSFETs With Nitrogen Incorporated $HfO_2$-$Al_2O_3$ Laminate Gate Dielectric," IEDM Tech. Dig. (2002), pp. 853-856.

(Continued)

*Primary Examiner* — Matthew E Warren
*Assistant Examiner* — Fang-Xing Jiang
(74) *Attorney, Agent, or Firm* — Patterson & Sheridan, LLP

(57) ABSTRACT

Method for producing a dielectric material on a semiconductor device and semiconductor device Method for producing a dielectric material on semiconductor device with an atomic layer deposition procedure, whereby an aluminum oxide nitride or a silicon oxide nitride or an aluminum silicon oxide nitride layer is deposited comprising a rare earth metal-element.

The invention describes a semiconductor device with a dielectric layer comprising aluminum oxide nitride or silicon oxide nitride or an aluminum silicon oxide nitride comprising a rare earth metal element.

12 Claims, 3 Drawing Sheets

FOREIGN PATENT DOCUMENTS

KR 1020040002818 1/2004

OTHER PUBLICATIONS

Masato Koyama et al., "Effect of Film Composition of Nitrogen Incorporated Hafnium Aluminate (HfAlON) Gate Dielectric on Structural Transformation . . . ," Japanese Journal of Applied Physics, vol. 43, No. 4B, 2004, pp. 1788-1794.

Katsuyuki Sekine et al., "Nitrogen Profile Control by Plasma Nitridation Technique for Poly-Si Gate HfSiON CMOSFET with Excellent . . . ,"IEDM Tech. Dig. (2003), pp. 102-106.

Masahiro Koike et al., "Effect of Hf-N Bond on Properties of Thermally Stable Amorphous HfSiON and Applicability of this Material to . . . ," IEDM Tech. Dig. (2003), pp. 107-110.

* cited by examiner

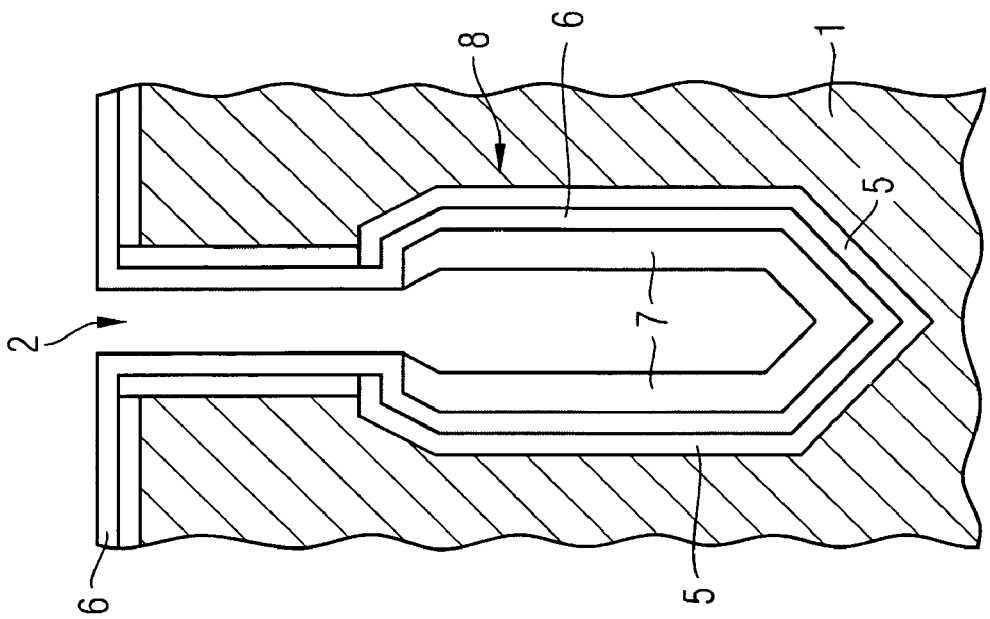
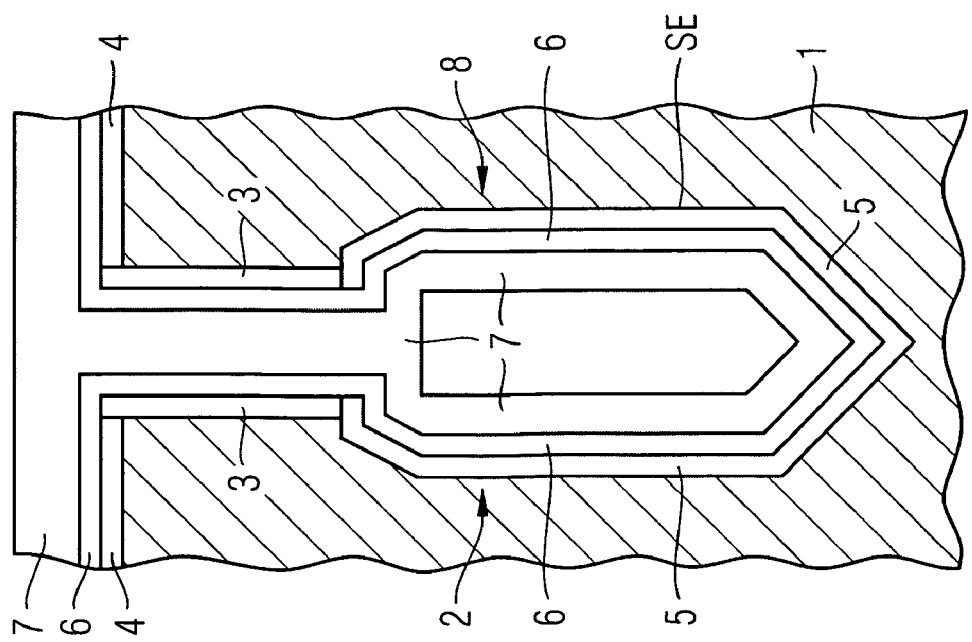

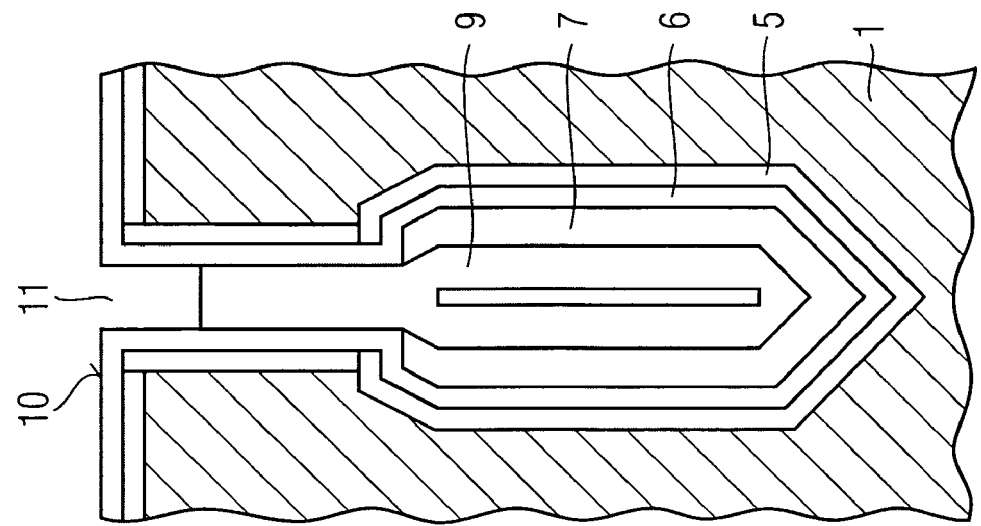
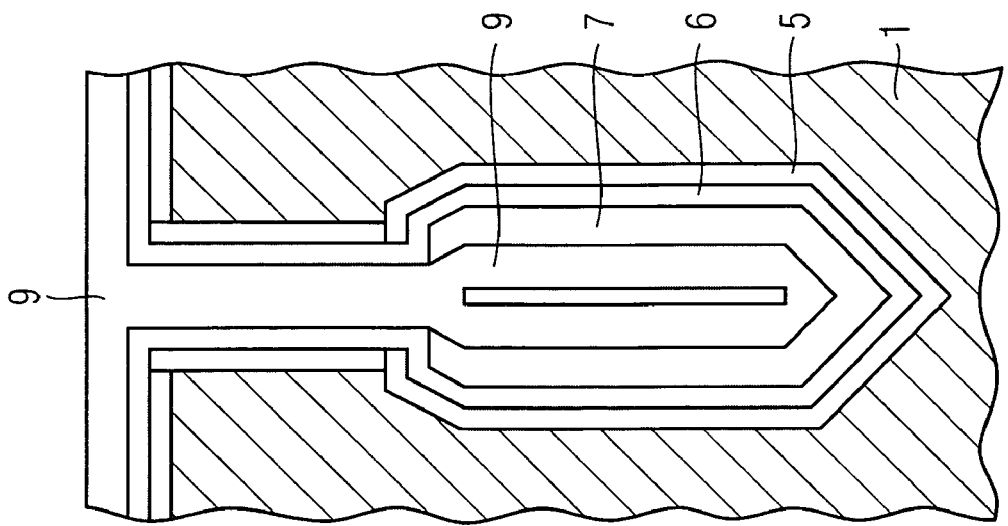

METHOD FOR PRODUCING A DIELECTRIC MATERIAL ON A SEMICONDUCTOR DEVICE AND SEMICONDUCTOR DEVICE

BACKGROUND OF THE INVENTION

1. Field of the Invention

The present invention refers to a method for producing a dielectric material on a semiconductor device and producing a semiconductor device with a dielectric material for example a DRAM memory. For different technical solutions it is an advantage to use a dielectric material in a semiconductor device that comprises a high dielectric constant. The dielectric layer with a high dielectric constant may be used in a transistor or in a capacitor of a semiconductor device, for example a semiconductor memory.

2. Description of the Related Art

In the state of the art several methods are known for producing a dielectric layer on a semiconductor device. For example it is known by the US patent application US 2004/0198069 A1 a method for forming a layer comprising hafnium on a substrate surface sequentially exposing the substrate surface to a hafnium precursor to form a hafnium layer on a substrate surface; reacting a second precursor with the hafnium containing layer; reacting a third precursor with the hafnium containing layer; reacting a fourth precursor with the hafnium containing layer. The deposited compound film comprises hafnium and at least three elements selected from the group consisting of silicon, aluminum, oxygen and nitrogen. The deposited dielectric layer can be realised as a hafnium silicon oxinitride and a hafnium aluminum oxygen nitride, hafnium silicon aluminum nitride and hafnium silicon aluminum oxide nitride.

Furthermore it is known to produce a laminate gate dielectric in a SiMOS FET with nitrogen incorporated in a hafnium oxide aluminum oxide laminate by Hyung-Seok Jung et al., in "Improved Current Performance of CMOSFETs with Nitrogen Incorporated HfO2-Al2O3 Laminate Gate Dielectric", IEDM Tech. Dig. (2002), pages 853-856.

Furthermore it is known by Masato Koyama et al., in "Effect of Film Composition of Nitrogen Incorporated Hafnium Aluminate Gate Dielectric on Structural Transformation and Electrical Pproperties through High-Temperature Annealing", Japanese Journal of Applied Physics, volume 43, No. 4B, 2004, pages 1788-1794, to use a nitrogen incorporated hafnium aluminate gate dielectric layer as a high k-material for a SIMOS device.

Furthermore it is known by Katsuyuki Sekine et al., in "Nitrogen Profile Control by Plasma Nitridation Technique for Poly-Si Gate HfSiON CMOSFET with Excellent Interface Property and Ultra-low Leakage Current", IEDM Tech. Dig. (2003), pages 102-106, to use a poly-silicon gate on hafnium silicon oxynitride for a SiMOS field-effect transistor.

Furthermore it is known by Masahiro Koike et al., in "Effect of Hf—N Bond on Properties of Thermally Stable Amorphous HfSiON and Applicability of this Material to Sub-50 nm Technology Node LSIs", IEDM Tech. Dig. (2003), pages 107-110, to use hafnium silicon oxinitride as an ultra thin layer with high hafnium and high nitride concentration as a high k material.

In the field of semiconductor processing, memory device processing or other electronic device processing, atomic layer deposition is used for depositing high k material. As electronic devices continue to shrink and the density of devices continues to increase, the size and aspect ratio of the features are becoming more important with a high impact in the quality of the semiconductor device. Although there are different methods for producing a dielectric material with a high k-constant, there is furthermore a need for a method for depositing dielectric material with a high k-constant.

SUMMARY OF THE INVENTION

In one embodiment, the present invention is a method for producing a dielectric material on a semiconductor device with an atomic-layer deposition procedure, whereby an aluminum oxide nitride or a silicon oxide nitride layer or an aluminum silicon oxide nitride is deposited comprising an element of the rare earth metals. The rare earth metals have in combination with the aluminum oxide nitride or the silicon oxide nitride or the aluminum silicon oxide nitride the advantage to provide a dielectric layer with a high dielectric k-constant and with suitable characteristics that are necessary for semiconductor processing especially for arrangements with a high density of semiconductor devices and a high aspect ratio especially for semiconductor memories.

In another embodiment, the present invention is a method for producing a dielectric material on the semiconductor device with an atomic layer deposition, whereby a first layer comprises aluminum oxide, a second layer comprises aluminum nitride, a third layer comprises a rare earth metal oxide and a fourth layer comprises a rare earth metal nitride. The combination of these four layers leads to a dielectric material that could be easily produced and has suitable mechanical and chemical properties for different semiconductor devices for example for semiconductor memories or semiconductor transistors.

In a further embodiment of the invention the dielectric material comprises a first layer of silicon oxide, a second layer of silicon nitride, a third layer of a rare earth metal oxide and a fourth layer of a rare earth metal nitride. Also this combination of layers is of advantage for producing a dielectric material. This dielectric material can easily be produced and has advantageous mechanical and chemical properties.

In a further embodiment of the invention the dielectric material comprises a first layer of silicon oxide, a second layer of silicon nitride, a third layer of aluminum oxide, a fourth layer of aluminum nitride, a fifth layer of a rare earth metal oxide and a sixth layer of a rare earth metal nitride. Also this combination of layers is of advantage for producing a dielectric material. This dielectric material can easily be produced and has advantageous mechanical and chemical properties.

In another embodiment the aluminum oxide nitride layer comprises more than 30 percent by weight of nitrogen.

In a further embodiment of the invention the aluminum oxide nitride layer comprises less than 50 percent by weight of the rare earth metal-element.

In another embodiment of the invention the silicon oxide nitride layer comprises more than 20 percent by weight of nitrogen.

Furthermore a dielectric material with good chemical, mechanical and electrical properties can be attained by using a silicon oxide nitride layer comprising more than 30 percent by weight of a rare earth metal-element.

In a further embodiment the semiconductor surface is prepared using a thermal nitride process or a plasma nitride process or a nitride implantation process. The preparation of the surface improves the quality of the dielectric material layer that is deposited by the atomic layer deposition on the semiconductor surface.

In a further embodiment of the invention a starting layer consisting of a rare earth metal is deposited before the dielectric material. The starting layer improves the deposition quality of the dielectric material.

Furthermore as a rare earth metal one element of the lanthanides or scandium or yttrium is used. With these elements a good quality of the dielectric material is attained.

In a further embodiment the invention relates to a semiconductor device comprising a dielectric material made of aluminum oxide nitride or silicon oxide nitride or aluminum silicon oxide nitride comprising an element of the rare earth metals.

In another embodiment a semiconductor memory with a capacitor is provided, whereby the capacitor comprises a dielectric material with aluminum oxide nitride or silicon oxide nitride or aluminum silicon oxide nitride comprising one element of the rare earth metals. This dielectric material has good electrical, mechanical and chemical properties and can be used for a structure with high aspect ratios.

In a further embodiment of the invention the dielectric material is used in a semiconductor device comprising a transistor, whereby the dielectric material constitutes a layer of the transistor.

The present invention is based on the idea to propose a dielectric material for a semiconductor device with improved electrical, chemical and/or mechanical properties. This object is attained by a dielectric material with an aluminum oxide nitride or a silicon oxide nitride or an aluminum silicon oxide nitride layer comprising an element of the rare earth metals. This dielectric material has a high dielectric constant k, can easily be deposited by an atomic layer deposition and has preferable mechanical, electrical and/or chemical properties. With this dielectric material especially transistors or capacitors for example in semiconductor memories can be produced.

BRIEF DESCRIPTION OF THE DRAWINGS

These and other objects and features of the present invention will become clear from the following description taken in conjunction with the accompanying drawings in which:

FIG. 1 is a sectional view of a semiconductor device at a first process step,

FIG. 2 is a sectional view of the semiconductor device at a second process step, FIG. 3 is a sectional view of the semiconductor device at a third process step, FIG. 4 is a sectional view of the semiconductor device at a fourth process step, FIG. 5 a sectional view of a dielectric material with four layers, and FIG. 6 a sectional view of a dielectric material with six layers.

DESCRIPTION OF THE PREFERRED EMBODIMENTS

Figure 5:
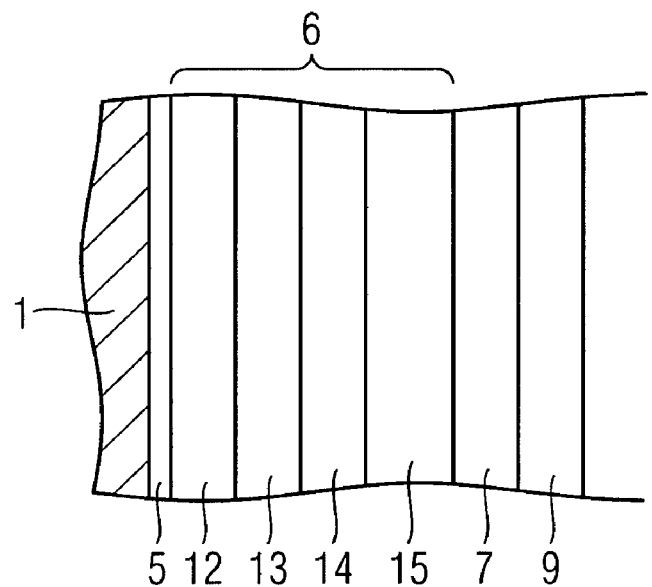

The present invention provides methods for producing a dielectric material on a semiconductor device using an atomic layer deposition procedure with an aluminum oxide nitride or a silicon oxide nitride layer or aluminium silicon oxide nitride comprising a rare earth metal. Furthermore the present invention provides semiconductor devices comprising a dielectric material comprising an aluminum oxide nitride or a silicon oxide nitride or a aluminium silicon oxide nitride layer comprising a rare earth metal.

The inventive method and the inventive semiconductor device are explained with the example of a capacitor in a semiconductor substrate. The capacitor is for example a part of a memory cell of a memory device. The method and the dielectric material could also be used in a transistor of a semiconductor device for example in a memory device or in any other semiconductor devices with a dielectric material.

For producing the dielectric material on the semiconductor device the atomic layer deposition is used whereby a metal aluminum oxide nitride or a metal silicon oxide nitride or a metal aluminium silicon oxide nitride dielectric material is produced. As a metal one of the rare earth elements is used. As a rare earth metal (=RE) basically the elements lanthanides, scandium or yttrium could be used. The lanthanides comprise Lanthanum, Cerium, Praseodymium, Neodymium, Promethium, Samarium, Europium, Gadolinium, Terbium, Dysprosium, Holmium, Erbium, Thulium, Ytterbium and Lutetium. To produce the aluminum oxide nitride layer comprising a rare earth metal four depositing process steps where used.

In the first step a rare earth metal oxide is deposited to produce an oxygen rare earth metal connection. In a second deposition process an aluminum oxide is deposited to produce an aluminum oxygen connection. In a third deposition process aluminum nitride is deposited providing an aluminum nitride connection. Furthermore a rare earth metal nitride is deposited to provide a rare earth metal nitride connection.

For the deposition of the rare earth metal different precursors may be used during the atomic layer deposition. A first group of precursors are constituted by amidinates: RE(R/amd) 3, whereby R equals iPr (iso-propyl) or tBu (tert-butyl) etc. and amd equals azetamidinato.

A second group of precursors are constituted by alkoxides: $RE(OR)_3$, $RE(OR) \times (mmp)_{3-x}$ with R=tBu, iPr, Me, . . . and mmp=1-methoxy-2methyl-2-propa-nolate (MeOMeCHCH$_2$OMe)

A third group of the precursors are constituted by cyclopentadienyle:
RE$(Cp)_3$, $RE(CpCH_3)_3$, $RE(CH_3)(Cp)_2$, . . . with Cp=C$_5$H$_5$ or C$_5$MeH$_4$ or C$_5$EtH$_4$ or C$_5$Me$_5$ or C$_5$iPr$_3$H$_2$.

A fourth group of precursers for depositing the rare earth metal is tetramethylheptane-3,5-dionate compounds: RE(thd)$_3$ with thd=2,2,6,6-tetramethylheptane-3,5-dionate.

Atomic layer deposition (ALD) utilizes sequential precursor gas pulses to deposit a film one layer at a time. As a basic process, as first precursor gas is introduced into the process chamber and produces a monolayer of gas on the wafer surface. A second precursor of gas is then introduced into the chamber reacting with the first precursor to produce a monolayer of film on the wafer surface. Since each pair of gas pulses (one cycle) produces exactly one monolayer of film the thickness of the resulting film may be precisely controlled by the number of deposition cycles.

The whole deposition of the dielectric material of the semiconductor device comprises several repetitions of an at least four-step-process with one of the following embodiments: In the first embodiment the first, the second, the third and the fourth deposition process step is repeated several times until a predetermined thickness of the dielectric material is attained.

In a second embodiment the first, the second, the third and the fourth deposition process steps are repeated several times with different numbers of repetitions for each process step. This means that each process step may be repeated directly a predetermined number until the following deposition process step is done. The deposition process steps may be initiated in different order.

In one embodiment the atomic layer deposition process starts with aluminum oxide or aluminum nitride layer to get a good basis for depositing the dielectric material. In a further embodiment the surface of the semiconductor device is prepared before starting the atomic layer deposition process with a thermal nitration using $NH_3$ or a plasma nitration or a nitride implantation is used to produce a better surface for the atomic layer deposition procedure of the dielectric material.

Due to the atomic layer deposition process as discussed above it is possible to change the composition of the individual elements for example the composition of the rare earth metal within the thickness of the dielectric material. Depending on the embodiment it might be an advantage to change the composition starting with a higher percentage of aluminum and changing along the thickness of the dielectric material to a higher percentage of the rare earth metal. Furthermore it may be an advantage to start with a higher concentration of oxygen and change within the thickness of the dielectric material to a higher concentration of nitrogen.

Furthermore the aluminum oxide nitride rare earth metal layer comprises more than 30 percent by weight of nitrogen. In another embodiment the rare earth metal aluminum oxide nitride comprises less than 50% of rare earth metal. Preferably the deposited dielectric material is covered with a cover layer before starting a thermal process to prevent a diffusion of nitrogen. Due to the atomic layer deposition process a good covering of rim areas is possible also on a structure with a high aspect ratio.

In a further embodiment instead of aluminum oxide and aluminum nitride also silicon oxide and silicon nitride may be used. In this embodiment a rare earth metal silicon oxide nitride layer is deposited.

In a further embodiment also aluminum oxide, aluminum nitride, silicon oxide and silicon nitride may be used. In this embodiment a rare earth metal silicon aluminum oxide nitride layer is deposited.

Furthermore the surface of the semiconductor device might be prepared by depositing a starting layer comprising silicon oxide or silicon nitride. This preparation improves the quality of the deposited dielectric material layer.

The rare earth metal silicon oxide nitride layer comprises in a further embodiment more than twenty percent by weight of nitrogen. The further embodiment the rare earth metal silicon oxide nitride layer comprises more than thirty percent by weight of the rare earth metal.

In a further embodiment a rare earth metal silicon aluminum oxide nitride layer is deposited.

The rare earth metal silicon aluminum oxide nitride layer comprises in a further embodiment more than twenty percent by weight of nitrogen. In a further embodiment the rare earth metal silicon aluminium oxide nitride layer comprises more than thirty percent by weight of the rare earth metal.

The dielectric material could be used in all technical embodiments that use a dielectric layer with a high dielectric constant k.

The FIGS. 1 to 4 depict some process steps that are used producing a trench capacitor as an example for a memory cell of a memory device.

FIG. 1 depicts a sectional view of a semiconductor substrate that consists of semiconductor material for example silicon or gallium. In the semiconductor substrate 1 a deep trench 2 with a collar rim 3 is processed. The collar rim consists for example of silicon oxide. In a cleaning process the surface of the collar rim 3 and of the deep trench 2 is cleaned for example with wet chemical solutions. Then the surface may be conditioned with a rapid thermal processing.

The upper surface of the substrate 1 is covered with a cover layer 4. The cover layer 4 is made of silicon nitride in this embodiment.

Then a thin metal layer 5 is deposited on the surface of a bottle region 8 of the deep trench 2. The thickness of the metal layer 5 may be in the region of 5 nm. The metal layer constitutes a starting layer 5 that comprises a rare earth metal. After this the dielectric material 6 is deposited by the atomic layer deposition process as discussed above. The dielectric layer 6 covers the deep trench, the collar rim and the surface of the substrate. The atomic layer deposition is processed as described above.

Then in a further process step a conducting layer 7 is deposited on the surface of the deep trench, filling up the opening of the deep trench. This process step is shown in FIG. 1. As a metal material for the conducting layer 7 titanium nitride may be used.

In a following process the conducting layer 7 is removed from the surface of the substrate 1 and the surface of the collar rim 3. In a bottle region 8 of the deep trench the conducting layer 7 remains on the surface of the deep trench 2. This process step is shown in FIG. 2.

In a following process step the dielectric layer 6 is removed from the collar rim 3 and the upper surface of the substrate 1. The dielectric layer 6 remains on the surface of the bottle region 8 of the deep trench 2.

Then the deep trench 2 is filled up with a second conducting layer 9. The second conducting layer 9 may consist of poly silicon. Depending on the embodiment also other conducting materials might be used. This process step is shown in FIG. 3.

After this the second conducting layer 9 is removed from the upper surface 10 of the substrate and from an upper region 11 of the collar rim 3. This process step is shown in FIG. 4, that depicts a capacity arrangement with a first and second electrode constituted by the starting layer 5 and the conducting layer 7. Between the two electrodes the dielectric layer 6 is arranged that is made of the dielectric material.

FIG. 5 depicts a sectional view of the dielectric material 6 comprising four layer 12, 13, 14, 15. The four layers consist in one embodiment of an aluminum oxide layer, one aluminum nitride layer, a rare earth metal oxide layer and a rare earth metal nitride layer.

In another embodiment the four layers of the dielectric material consist of a silicon oxide layer, a silicon nitride layer, a rare earth metal oxide layer and a rare earth metal nitride layer.

Figure 6:
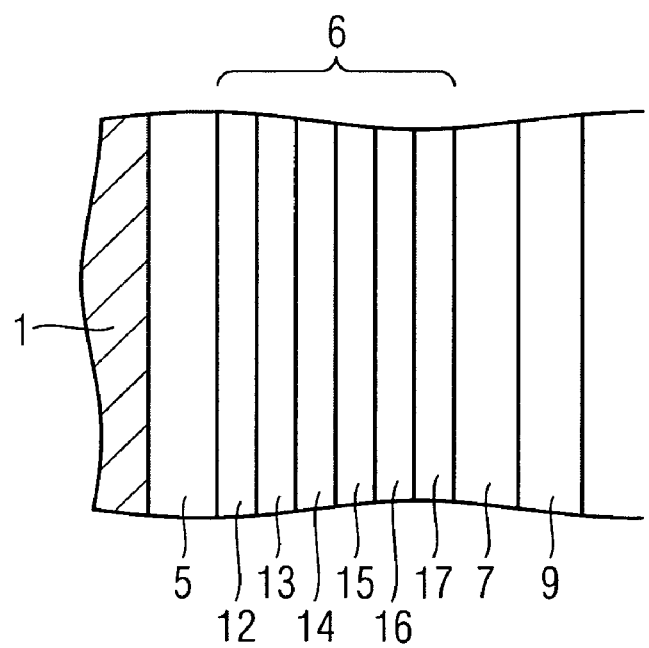

FIG. 6 depicts another embodiment of the dielectric material 6, consisting of a first, a second, a third, a fourth, a fifth and a sixth layer 12, 13, 14, 15, 16, 17. The six layers of the dielectric material consist of a silicon oxide layer, a silicon nitride layer, an aluminum oxide layer, an aluminum nitride layer, a rare earth metal oxide layer and a rare earth metal nitride layer.

The position of the single layers within the layer arrangements of FIGS. 5 and 6 may change depending on the embodiment.

REFERENCE LIST 1 substrate
2 deep trench
3 collar rim
4 cover layer
5 starting layer
6 dielectric layer 7 conducting layer
8 bottle region
9 second conducting layer
10 upper surface
11 upper region
12 first layer
13 second layer
14 third layer
15 fourth layer
16 fifth layer
17 sixth layer

The invention claimed is:

1. A semiconductor memory comprising:
a dielectric layer comprising aluminum oxide nitride and a rare earth metal element; and
a storage capacitor, wherein the dielectric layer forms a dielectric of the storage capacitor, wherein the dielectric layer comprises at least four different layers deposited by an atomic layer deposition process, wherein the at least four different layers comprise:
a first layer comprising an aluminum oxide, a second layer comprising an aluminum nitride, a third layer comprising a rare earth metal oxide and a fourth layer comprising a rare earth metal nitride.

2. The semiconductor memory according to claim 1, whereby a fifth layer comprises a silicon oxide, a sixth layer comprises a silicon nitride.

3. The semiconductor memory according to claim 1, further comprising a transistor, whereby the dielectric material constitutes a dielectric layer of the transistor.

4. A semiconductor device comprising:
a transistor with a dielectric layer, wherein the dielectric layer comprises aluminum silicon oxide nitride and a rare earth metal element, wherein the dielectric layer comprises at least four different layers deposited by an atomic layer deposition process, wherein the at least four different layers comprise:
a first layer comprising an aluminum oxide, a second layer comprising an aluminum nitride, a third layer comprising a rare earth metal oxide and a fourth layer comprising a rare earth metal nitride.

5. The semiconductor device according to claim 4, wherein the dielectric layer comprises at least two additional different layers deposited by an atomic layer deposition process and wherein the at least two additional different layers comprise:
a fifth layer comprising a silicon oxide and a sixth layer comprising a silicon nitride.

6. The semiconductor device according to claim 4, further comprising a capacitor, wherein the dielectric material constitutes a dielectric layer of the capacitor.

7. A semiconductor memory comprising:
a dielectric layer comprising aluminum oxide nitride and a rare earth metal element; and
a capacitor, wherein the dielectric layer forms a dielectric of the capacitor, wherein the dielectric layer comprises at least four different layers deposited by an atomic layer deposition process, and wherein the at least four different layers comprise:
a first layer comprising a silicon oxide, a second layer comprising a silicon nitride, a third layer comprising a rare earth metal oxide and a fourth layer comprising a rare earth metal nitride.

8. The semiconductor memory according to claim 7, whereby a fifth layer comprises an aluminum oxide and a sixth layer comprises an aluminum nitride.

9. The semiconductor memory according to claim 7, further comprising a transistor, whereby the dielectric material constitutes a dielectric layer of the transistor.

10. A semiconductor device comprising:
a transistor with a dielectric layer, wherein the dielectric layer comprises aluminum silicon oxide nitride and a rare earth metal element, wherein the dielectric layer comprises at least four different layers deposited by an atomic layer deposition process, wherein the at least four different layers comprise:
a first layer comprising a silicon oxide, a second layer comprising a silicon nitride, a third layer comprising a rare earth metal oxide and a fourth layer comprising a rare earth metal nitride.

11. The semiconductor device according to claim 10, wherein the dielectric layer comprises at least two additional different layers deposited by an atomic layer deposition process and wherein the at least two additional different layers comprise:
a fifth layer comprising an aluminum oxide and a sixth layer comprising an aluminum nitride.

12. The semiconductor device according to claim 10, further comprising a capacitor, wherein the dielectric material constitutes a dielectric layer of the capacitor.

* * * * *